(12) United States Patent
Kawano et al.

(10) Patent No.: US 7,535,608 B2
(45) Date of Patent: May 19, 2009

(54) HOLOGRAM RECORDING METHOD AND HOLOGRAM RECORDING APPARATUS

(75) Inventors: Katsunori Kawano, Ashigarakami-gun (JP); Koichi Haga, Ashigarakami-gun (JP); Shin Yasuda, Ashigarakami-gun (JP); Makoto Furuki, Ashigarakami-gun (JP); Jiro Minabe, Ashigarakami-gun (JP); Yasuhiro Ogasawara, Ashigarakami-gun (JP); Kazuhiro Hayashi, Ashigarakami-gun (JP); Hisae Yoshizawa, Ashigarakami-gun (JP)

(73) Assignee: Fuji Xerox Co., Ltd., Tokyo (JP)

( * ) Notice: Subject to any disclaimer, the term of this patent is extended or adjusted under 35 U.S.C. 154(b) by 234 days.

(21) Appl. No.: 11/330,179

(22) Filed: Jan. 12, 2006

(65) Prior Publication Data

US 2006/0245020 A1    Nov. 2, 2006

(30) Foreign Application Priority Data

May 2, 2005    (JP) .............................. 2005-134314
Oct. 24, 2005    (JP) .............................. 2005-309117

(51) Int. Cl.
*G03H 1/16*    (2006.01)

(52) U.S. Cl. .......................................... 359/29; 359/30

(58) Field of Classification Search ........................ None
See application file for complete search history.

(56) References Cited

U.S. PATENT DOCUMENTS

| 6,285,474 | B1 | 9/2001 | Kawano et al. |
| 6,317,404 | B1 | 11/2001 | Kawano et al. |
| 2002/0135832 | A1 | 9/2002 | Edwards |
| 2003/0025955 | A1* | 2/2003 | Curtis .................. 359/35 |

FOREIGN PATENT DOCUMENTS

| JP | A 2000-066565 | 3/2000 |
| JP | A-2000-066566 | 3/2000 |
| JP | A 2004-198816 | 7/2004 |
| JP | A 2004-265572 | 9/2004 |

OTHER PUBLICATIONS

Jin et al., "Holographic Data Storage with Fractional Fourier Transform," 198 Optics Communications 57-63 (Oct. 15, 2001).
Yang et al., "Improving Holographic Data Storage by use of an Optimized Phase Mask," Applied Optics 5641-5645 (Sep. 10, 1999).
Kawano et al., "Band-Pass Filtering in Holographic Data Storage," IEEE Annual Meeting Conference 475-476 (Oct. 2005).
Joseph et al., "Homogenized Fourier Transform Holographic Data Storage Using Phase Spatial Light Modulators and Methods for Recovery of Data from the Phase Image," 45 Applied Optics 6374-6380 (Sep. 1, 2006).
Yasuda et al., "Coaxial Holographic Data Storage without Recording the DC Components," 31 Optics Letters 2607-2609 (Sep. 1, 2006).

* cited by examiner

*Primary Examiner*—Stephone B. Allen
*Assistant Examiner*—Derek S Chapel
(74) *Attorney, Agent, or Firm*—Oliff & Berridge, PLC

(57) ABSTRACT

A hologram recording method includes eliminating a DC component from a Fourier transformation image of a signal light for expressing binary digital data as a brightness image, and irradiating an optical recording medium simultaneously with the signal light from which the DC component has been eliminated and a reference light to record an image edge portion of the signal light onto the optical recording medium as a hologram.

13 Claims, 20 Drawing Sheets

F I G. 1
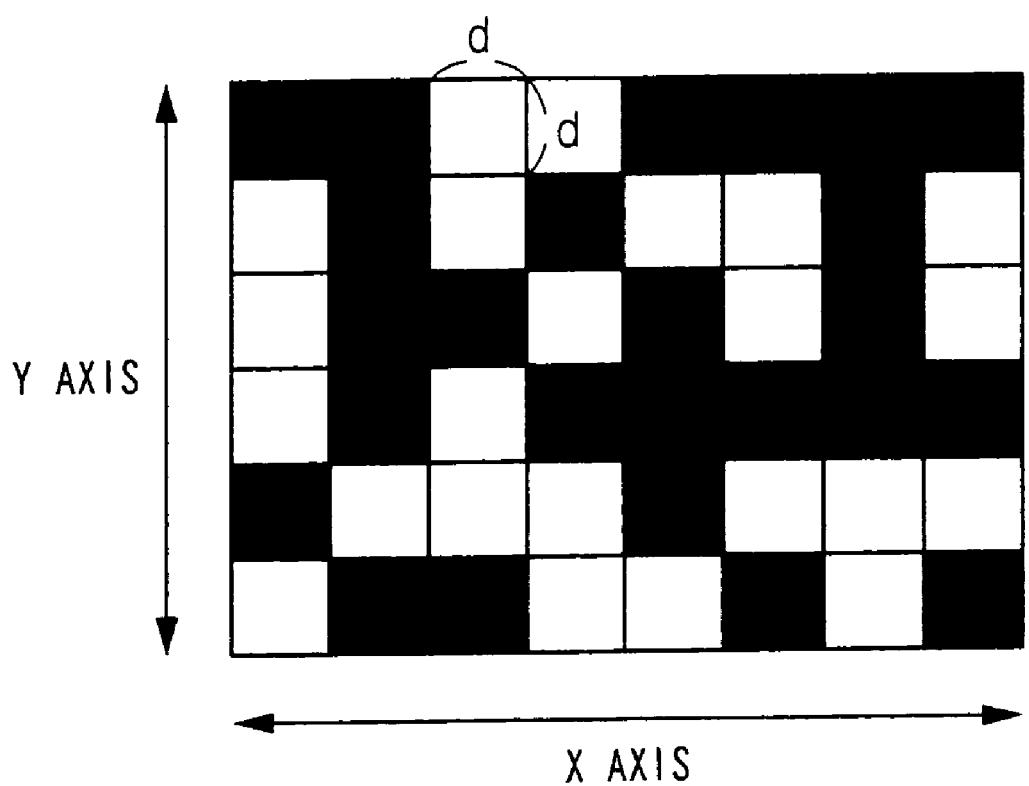

F I G. 5
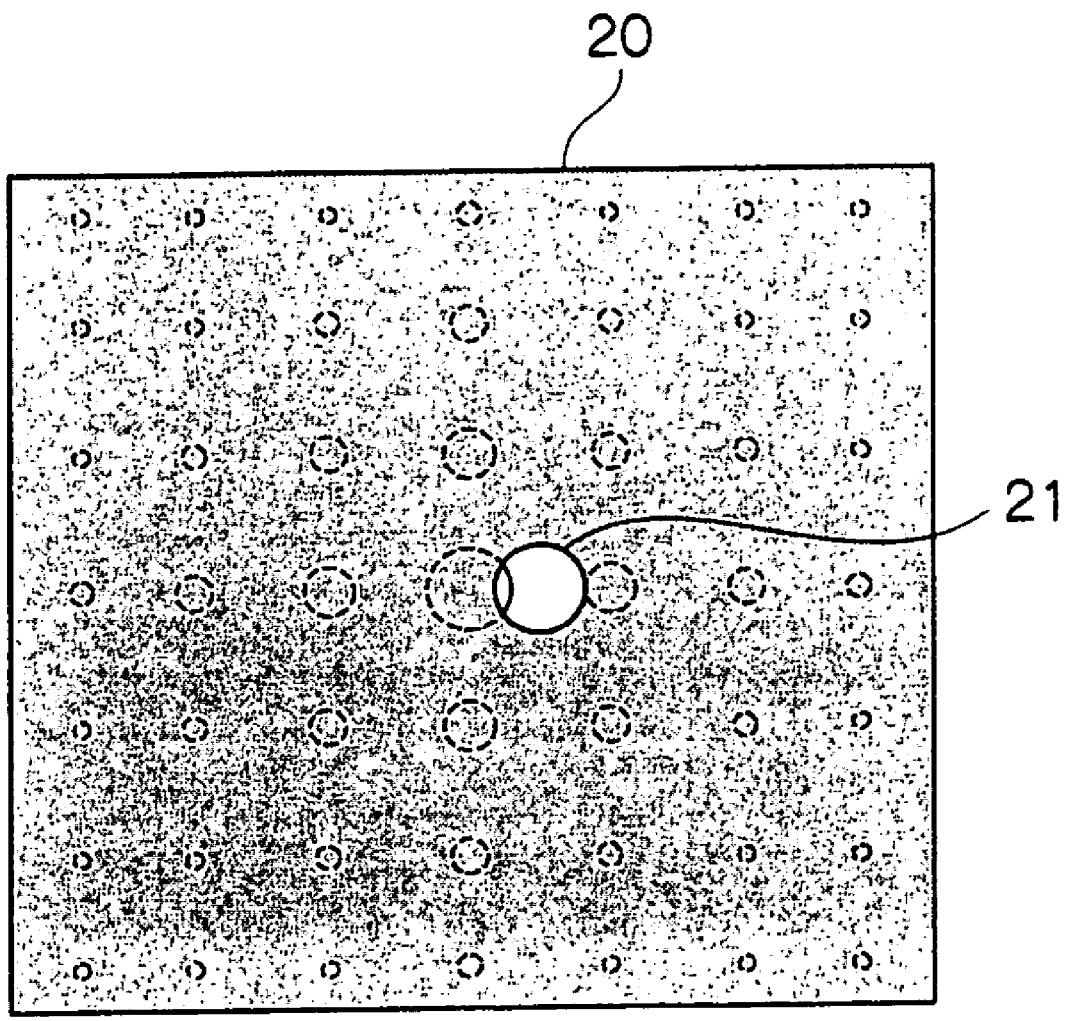

FIG. 11A
4mm φ
FIG. 11B
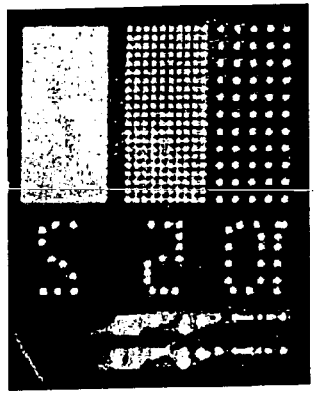
3mm φ
FIG. 11C
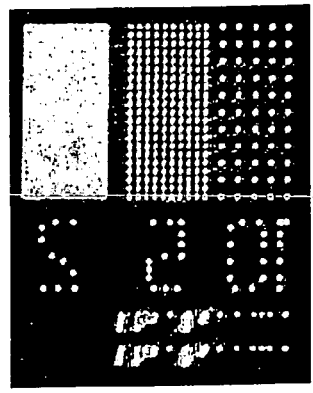
2mm φ
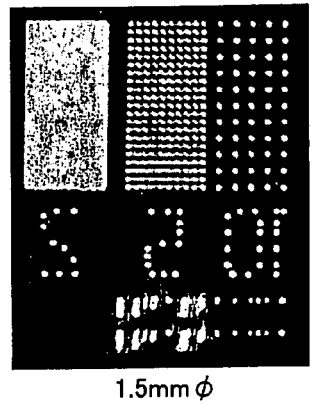
1.5mm φ
FIG. 11D
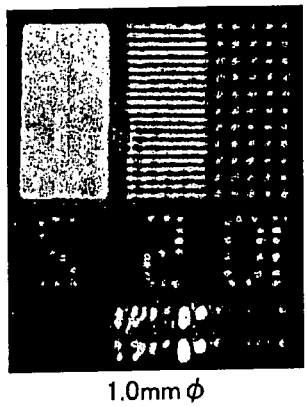
1.0mm φ
FIG. 11E
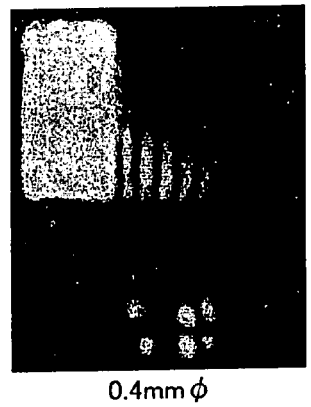
0.4mm φ
FIG. 11F

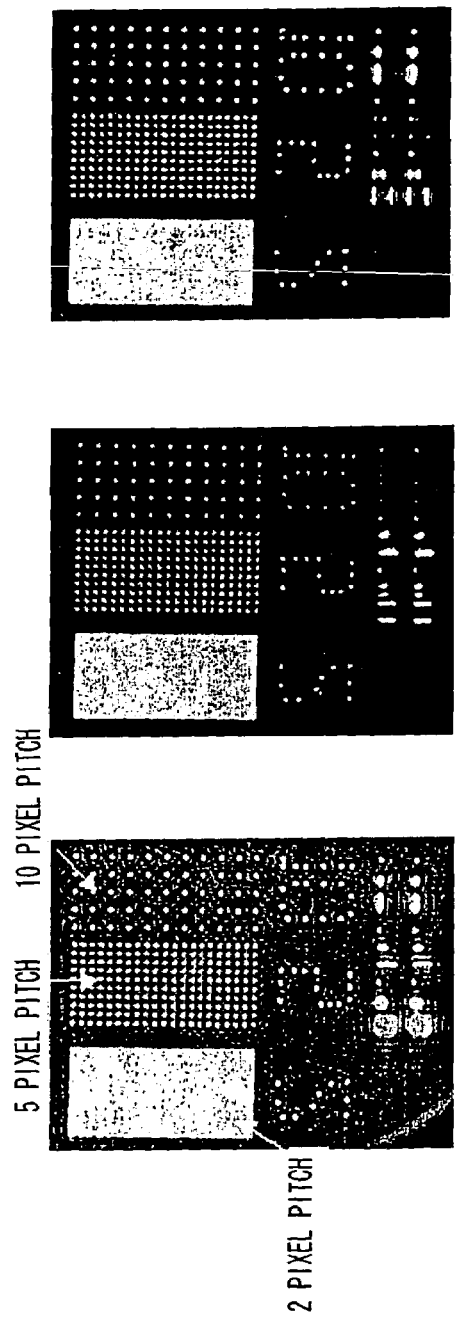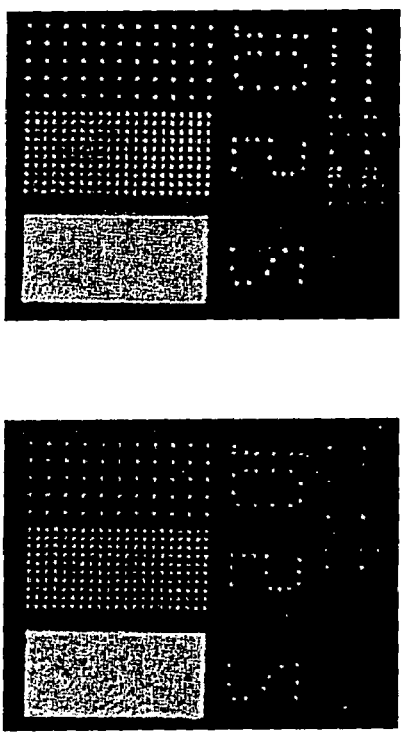

HOLOGRAM RECORDING METHOD AND HOLOGRAM RECORDING APPARATUS

CROSS-REFERENCE TO RELATED APPLICATION

This application claims priority under 35 USC 119 from Japanese Patent Application Nos. 2005-134314 and 2005-309117, the disclosure of which is incorporated by reference herein.

BACKGROUND OF THE INVENTION

1. Field of the Invention

The present invention relates to a hologram recording method and a hologram recording apparatus. The invention particularly relates to a method and an apparatus that record digital data as a hologram on an optical recording medium.

2. Description of the Related Art

In holographic data storage, binary digital data "0, 1" are converted into a digital image (signal light) as "bright, dark", and recorded and reproduced as a hologram. The signal light is Fourier-transformed by a lens, and a Fourier transformation image is irradiated onto an optical recording medium. Since the Fourier transformation image has infinite spread at its focal plane in principle, a recording region spreads. For this reason, in the holographic data storage, there is a problem that high-density recording cannot be achieved.

In order to solve this problem, the inventors of this invention propose a method of shielding a specific component of a Fourier transformation image of signal light (Japanese Patent Application Laid-Open (JP-A) No. 2000-66565). The Fourier transformation image of a digital image is a regular diffraction grating by means of Fraunhofer's diffraction, and has 0-th to n-th order components. The orders here are the order of bright spots which appear at every distance from the 0-th order (center) to $\zeta=f\lambda/d$ on a Fourier transformation plane, and are determined by a focal distance f of a lens, a recording wavelength $\lambda$, and a pixel pitch d of a spatial light modulator.

In the method described in JP-A No. 2000-66565, a light blocking body is disposed between a lens and an optical recording medium, and an aperture is formed in the light blocking body so that the 0-th order component of signal light is shielded and only an component of a specific order is transmitted, and an image edge portion of the signal light is recorded as a hologram. JP-A No. 2000-66565 concretely discloses that the 1-st order to 3-rd order components of the signal light are recorded. According to this method, useless exposure due to the 0-th order component is suppressed, and a recording region of each data page can be small.

Each high-order component which is the 1-st order and more, however, includes a DC component of the signal light. The DC component of the signal light is an unnecessary component for recording and reproducing of the image edge portion of a digital image. In the method described in JP-A No. 2000-66565, therefore, even if the 0-th order component is shielded, the useless exposure by means of the DC component of each high-order component cannot be prevented. As a result, there is a problem that S/N (signal-noise ratio) is reduced, and a dynamic range of an optical recording medium is wasted.

In general, the light intensity of the DC component is higher by 2 digits than a high-frequency component. As a potential of the optical recording medium, a performance of 1 terabyte/disc or more is demonstrated, but when digital data are recorded as a hologram, the demonstration level is several dozens gigabytes/disc. It is considered that this gap is generated because most of the dynamic range of the optical recording medium is wasted by the exposure of the DC component.

Further miniaturization of the recording region is also essential for high-density recording.

SUMMARY OF THE INVENTION

The present invention is devised in view of the above circumstances and provides a method and an apparatus that record digital data as a hologram at high S/N in high density.

A first aspect of the present invention is a hologram recording method which includes: eliminating a DC component from a Fourier transformation image of a signal light for expressing binary digital data as a brightness image; and irradiating an optical recording medium simultaneously with the signal light from which the DC component has been eliminated and a reference light to record an image edge portion of the signal light onto the optical recording medium as a hologram.

A second aspect of the present invention is a hologram recording method which includes: extracting an image edge portion from a Fourier transformation image of a signal light for expressing binary digital data as a brightness image; and irradiating an optical recording medium simultaneously with the signal light, from which the image edge portion has been extracted, and a reference light to record the image edge portion of the signal light onto the optical recording medium as a hologram.

A third aspect of the present invention is a hologram recording apparatus which includes: a light source that emits coherent light; a spatial light modulator that modulates the intensity of light emitted from the light source according to binary digital data to generate a signal light for expressing digital data as a brightness image; an imaging optical system that Fourier-transforms the signal light; a reference light optical system that obtains a reference light from the light emitted from the light source; and a filter that is arranged on a signal light irradiation side of an optical recording medium, and blocks a DC component of the 0-th order to the n-th order (n is an integer of 1 or more) of a Fourier transformation image by means of a light blocking section formed opposite to a bright spot of the Fourier transformation image to eliminate the DC component from the Fourier transformation image, wherein the Fourier-transformed signal light and the reference light are irradiated simultaneously onto the optical recording medium, and an image edge portion of the signal light is recorded onto the optical recording medium as a hologram.

BRIEF DESCRIPTION OF THE DRAWINGS

Embodiments of the present invention will be described in detail based on the following figures, wherein:

FIG. 1 is a diagram illustrating one example of a digital image (signal light);

FIG. 5 is a diagram illustrating one example of a filter that extracts a specific spatial frequency component of the Fourier transformation image shown in FIG. 4;

FIGS. 11A to 11F are diagrams illustrating filtering images according to the sizes of the pinhole;

FIGS. 13A to 13E are diagrams illustrating the filtering images according to the positions of the pinholes;

DETAILED DESCRIPTION OF THE INVENTION

One example of an embodiment of the present invention is explained in detail below with reference to the drawings.

(Principle of High S/N)

Figure 2:
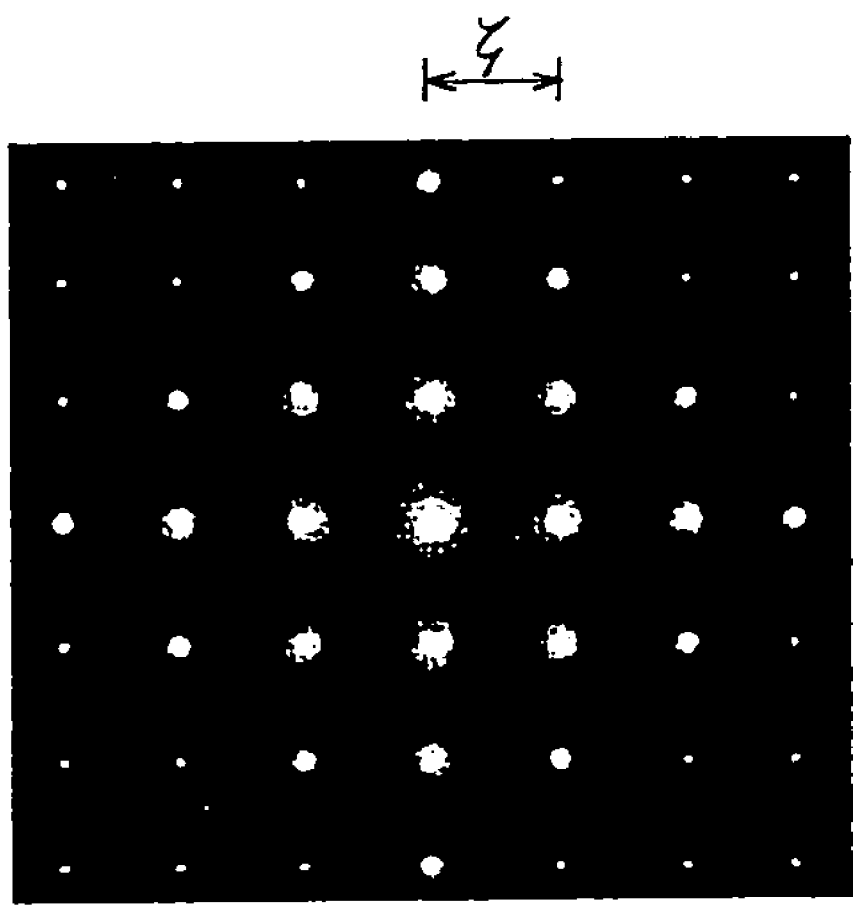
FIG. 2 is a diagram illustrating a Fraunhofer's diffraction image of the signal light.

FIG. 1 is a diagram illustrating one example of a digital image (signal light). In this drawing, binary digital data "0, 1" are converted into a digital image as "bright, dark". In holographic data storage, signal light is Fraunhofer-diffracted (Fourier-transformed) by a lens so that a Fraunhofer's diffraction image shown in FIG. 2 is recorded on an optical recording medium. When a spatial frequency of a data image is a normalized value such as digital data, the Fraunhofer's diffraction image becomes a Fourier transformation image of the signal light. Hereinafter, the Fraunhofer's diffraction image is referred to as the Fourier transformation image.

As shown in FIG. 2, the Fourier transformation image of the digital image is a regular diffraction grating, and has the 0-th order to n-th order components. The orders here are the order of bright spots which appear at every distance from the 0-th order (center) to $\zeta=f\lambda/d$ on a Fourier transformation plane, and are determined by a focal distance f of the lens, a recording waveform $\lambda$ and a pixel pitch d of a spatial light modulator.

Figure 3A:
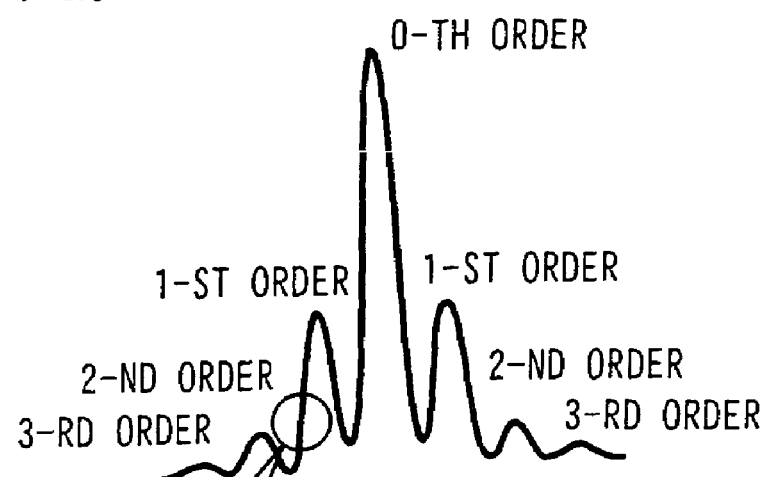
FIG. 3A is a diagram illustrating a Fourier transformation spectrum.
Figure 3B:
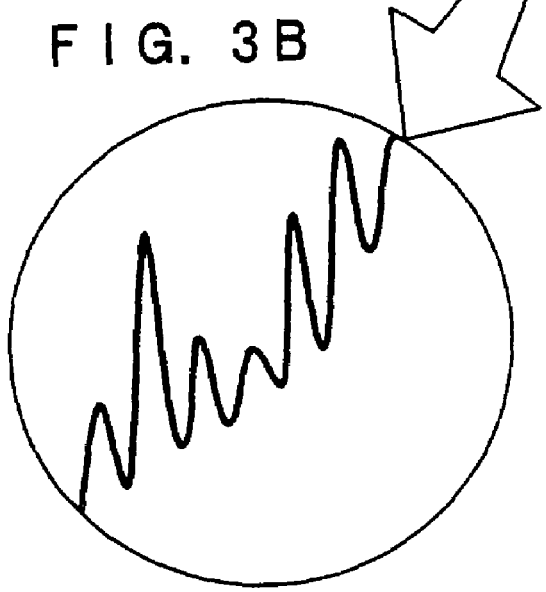
FIG. 3B is a partially enlarged diagram of FIG. 13A.

FIG. 3A is a diagram illustrating a Fourier transformation spectrum, and FIG. 3B is a partially enlarged diagram of FIG. 3A. As shown in FIG. 3A, the Fourier transformation spectrum has peaks according to DC components of respective orders at bright spots. As a result of keen examination, according to the knowledge acquired by the inventors and the others, information necessary for recording and reproducing of an edge portion of a digital image (hereinafter, "image edge component") is superposed between the bright spots at a high frequency as shown in FIG. 3B.

In an analog image, DC components composing an image background are required for recording and reproducing of an image. On the contrary, in a digital image, only an image edge component is necessary, but a DC component is not necessary. Therefore, a specific spatial frequency component such as the spatial frequency component shown in FIG. 3B between the bright spots is extracted from the Fourier transformation image so as to be recorded. As a result, the digital image can be recorded and reproduced, and useless exposure by means of a DC component is prevented so that S/N can be improved.

Figure 4:
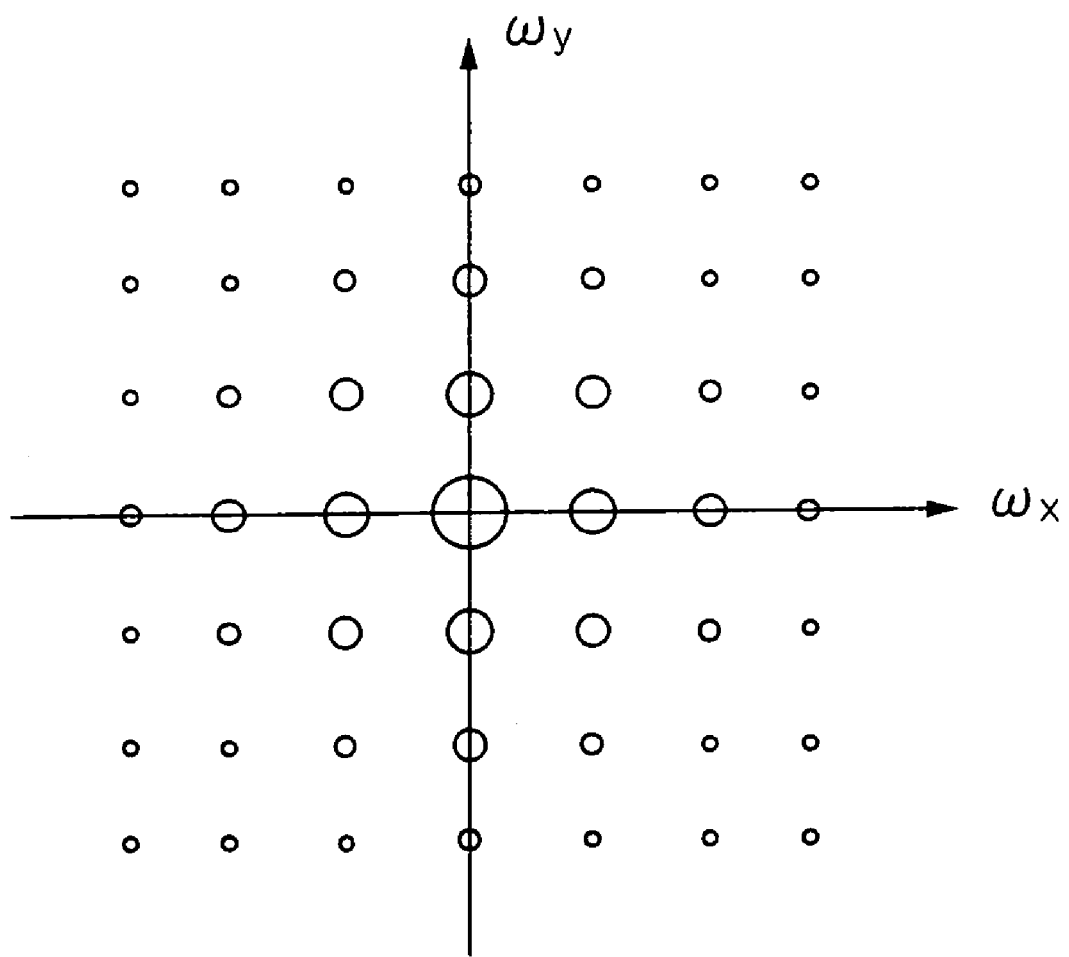
FIG. 4 is a diagram schematically illustrating a Fourier transformation image of the signal light.

FIG. 4 is a diagram schematically illustrating the Fourier transformation image of the signal light. A size of each bright spot reflects brightness. A spread of the Fourier transformation image to an x axial direction shown in FIG. 4 corresponds to a spatial frequency $\omega x$ of the data image to the x axial direction shown in FIG. 1. As to the x axial direction, the Fourier transformation image spreads to a plus direction and a minus direction symmetrically with the 0-th order light ($\omega x=0$) being the center. This is applied also to a y axial direction.

FIG. 5 is a diagram illustrating one example of a filter that extracts a specific spatial frequency component of the Fourier transformation image shown in FIG. 4 (hereinafter, "specific Fourier spectrum"). The filter 20 is arranged on an upper stream side of an optical recording medium and on a Fourier transformation plane of the signal light. As shown in FIG. 5, the filter 20 is a light blocking body which has a pinhole 21 opposed to a position between the 0-th order and the 1-st order on the x axis of the Fourier transformation image. When the filter 20 is disposed on the Fourier transformation plane, only a specific spatial frequency component between the bright spots can transmit through the filter 20, and the other spatial frequency components including a DC component are shielded. That is to say, the filter 20 functions as a band-pass filter that allows only a specific spatial frequency component to transmit therethrough. As a result, useless exposure by means of the DC component is prevented so that S/N is improved, and only the image edge portion of the signal light is recorded efficiently.

Figure 6:
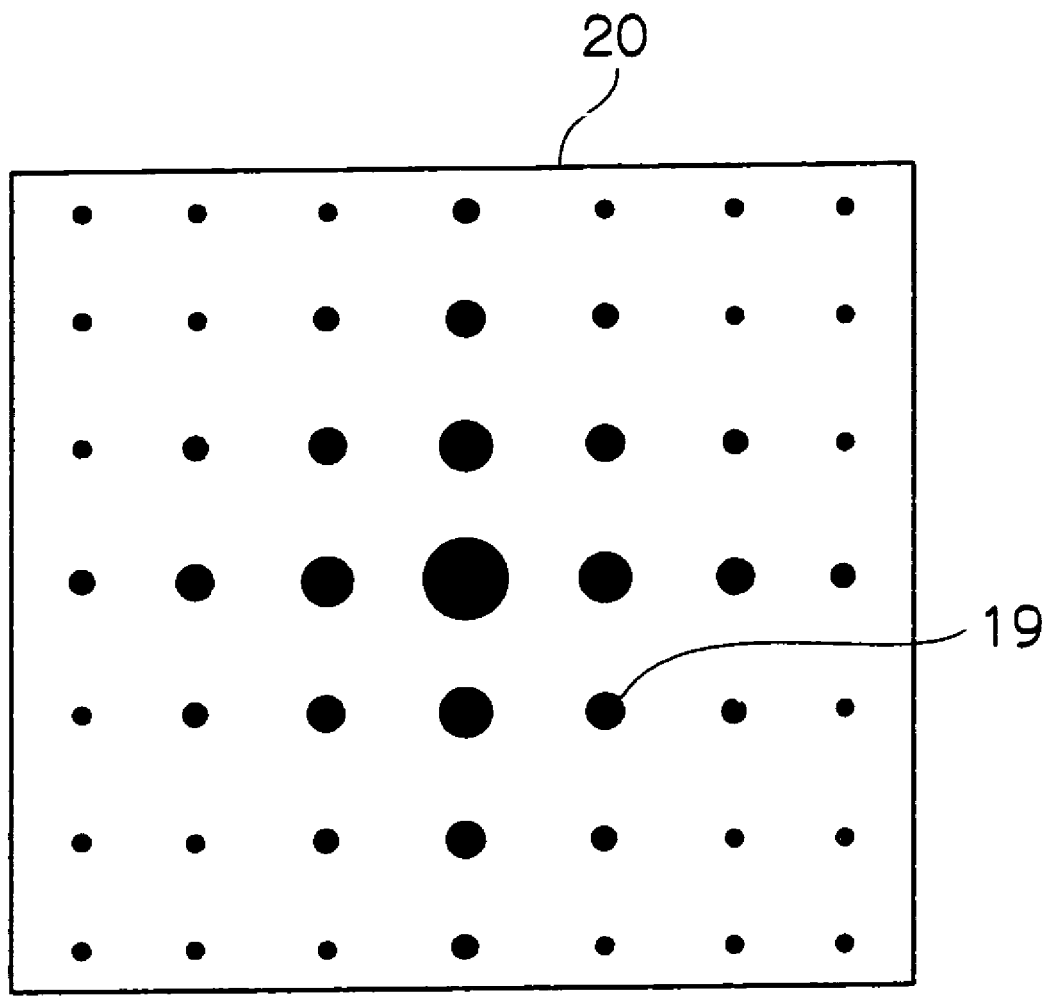
FIG. 6 is a diagram illustrating another example of the filter.

FIG. 6 is a view illustrating another example of the filter. As shown in FIG. 6, the filter 20 is a light transmission body which has a light blocking section 19 opposed to each bright spot of the Fourier transformation image. The light transmission body is formed by a transparent material for the signal light. When the filter having such a constitution is disposed on the Fourier transformation plane, only a specific spatial frequency component between the bright spots transmits through the filter 20, and the other spatial frequency components including the DC component can be shielded.

(Hologram Recording Apparatus)

Figure 7:
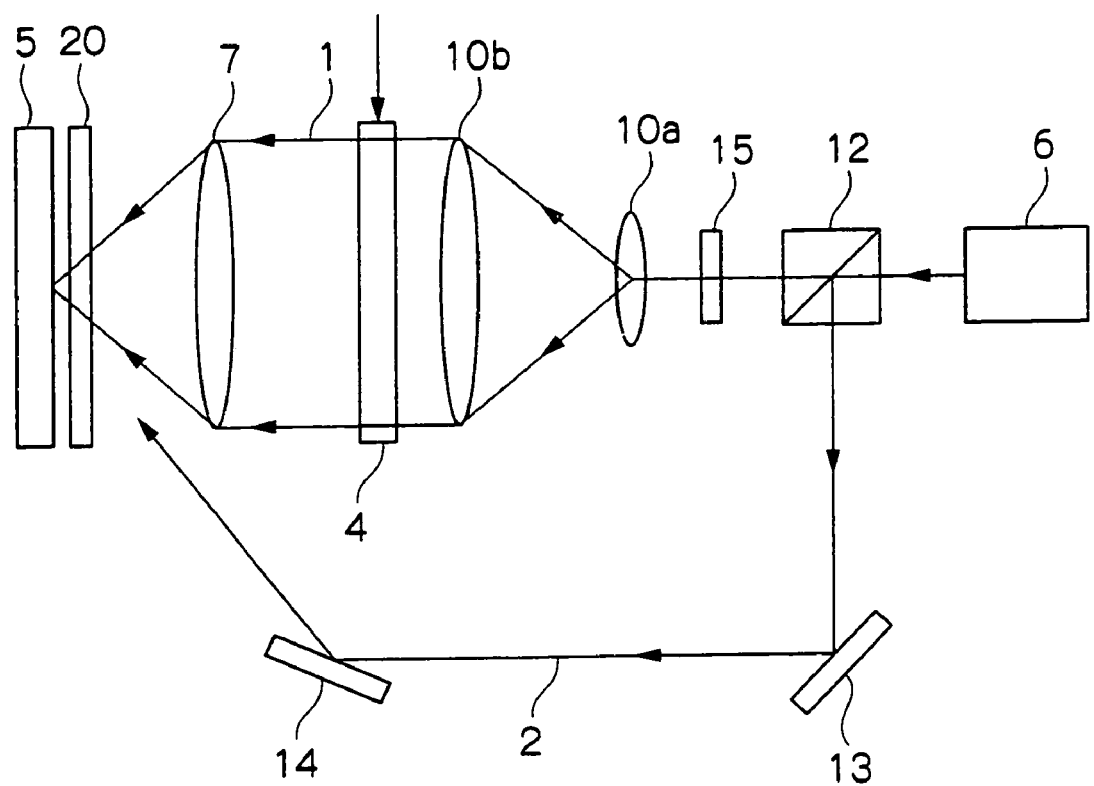
FIG. 7 is a diagram illustrating one example of a constitution of a hologram recording apparatus.

FIG. 7 is a diagram illustrating one example of a constitution of the hologram recording apparatus. The hologram recording apparatus is provided with a light source 6 that emits a laser beam as coherent light. A beam splitter 12 that separates the laser beam into light for signal light and light for reference light is disposed on a laser beam emission side of the light source 6.

A shutter 15 that blocks the light for signal light which transmits through the beam splitter 12 is disposed on a light transmission side of the beam splitter 12 so that the shutter 15 can be inserted to and retracted from an optical path. A lens system which is composed of collimating lenses 10a and 10b, and a Fourier transforming lens 7 is arranged in this order on a light transmission side of the shutter 15.

A transmission type spatial light modulator 4, which is composed of a liquid crystal display element and the like and modulates the laser beam for signal light according to digital data supplied from a computer, not shown, so as to generate a digital image (signal light 1) of each page, is arranged between the collimating lens 10b and the Fourier transforming lens 7. The filter 20 which has the pinhole 21 is disposed on a light transmission side of the Fourier transforming lens 7.

Reflection mirrors 13 and 14, which reflect the laser beam for reference light reflected by the beam splitter 12 and change the optical path to the direction of the optical recording medium 5, are arranged on a light reflection side of the beam splitter 12.

Hologram recording using the hologram recording apparatus is explained below. Firstly, the shutter 15 is retracted from the optical path by a driving device, not shown, so that a laser beam can pass. The laser beam which is emitted from the light source 6 is separated into two light beams of the light for signal light and the light for reference light by the beam splitter 12. The laser beam which transmits through the beam splitter 12 is collimated into a beam with a large diameter by the collimating lenses 10a and 10b so as to be irradiated as the light for signal light to the spatial light modulator 4.

Digital data are input from the computer, not shown, into the spatial light modulator 4. In the spatial light modulator 4, the intensity of the laser beam for signal light is modulated according to the supplied digital data so that signal light 1 is generated. The generated signal light 1 is Fourier-transformed by the Fourier transforming lens 7. The Fourier-transformed signal light 1 passes through the pinhole 21 of the filter 20 so as to be irradiated to the optical recording medium 5.

At the same time, the laser beam reflected by the beam splitter 12 is reflected by the reflection mirrors 13 and 14, and passes through the pinhole 21 of the filter 20 so as to be irradiated as reference light 2 to the optical recording medium 5. The reference light 2 is irradiated to a region to which the Fourier-transformed signal light 1 is irradiated. As a result, the Fourier-transformed signal light 1 interferes with the reference light 2 in the optical recording medium 5, and the image edge portion of the signal light 1 is recorded as a hologram onto the optical recording medium 5.

Figure 8A:
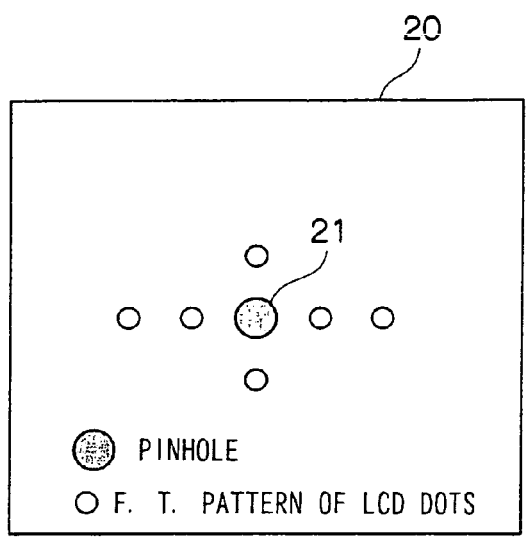
FIGS. 8A and 8B are diagrams illustrating positions of a pinhole formed on a light blocking body of the filter.
Figure 8B:
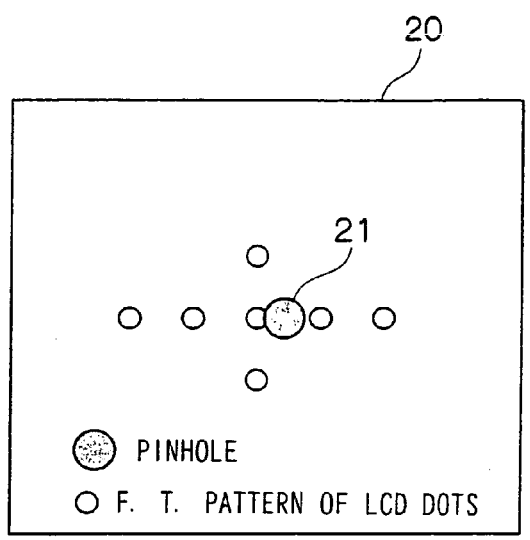
Figure 9A:
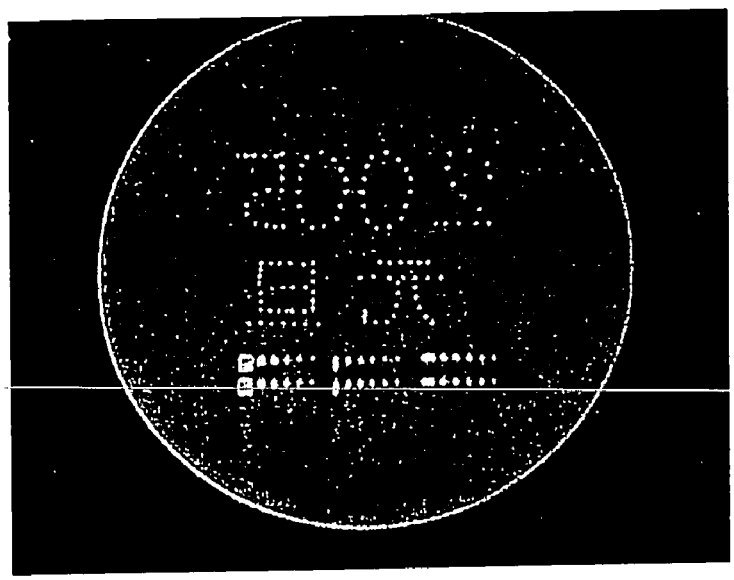
FIGS. 9A and 9B are diagrams illustrating filtering images according to the positions of the pinholes.
Figure 9B:
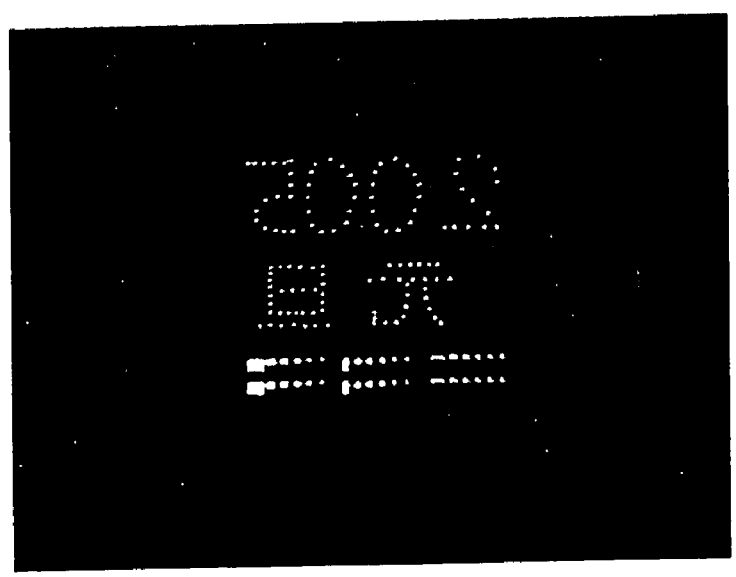

FIGS. 8A and 8B are diagrams illustrating positions of the pinhole 21 formed on the light blocking body of the filter 20. In order to verify the principle of high S/N, the spatial light modulator 4 creates the digital image using the hologram recording apparatus shown in FIG. 7, and the digital image is Fourier-transformed by the Fourier transforming lens 7. The filter 20 is arranged on the Fourier transformation plane, and while the position of the pinhole 21 is being changed, a Fourier spectrum is extracted, and then the image is inversely Fourier-transformed by another lens (not shown) so as to be observed by a CCD camera (not shown). The results are shown in FIGS. 9A and 9B. The image to be observed is not a hologram reproduced image, but is an image obtained by inversely Fourier-transforming a specific Fourier spectrum transmitted through the filter 20 (hereinafter, "filtering image").

In FIG. 8B, the pinhole 21 is formed so as to be opposed to a position between the 0-th order and 1-st order on the x axis of the Fourier transformation image. When the Fourier spectrum is extracted by the filter 20, as shown in FIG. 9B, it is found that high S/N is realized. On the contrary, as shown in FIG. 8A, in the filter 20 in which the pinhole 21 is formed so as to be opposed to a position including the 0-th order (center) of the Fourier transformation image, as shown in FIG. 9A, a background of the image (DC component) is concentrated on the 0-th order. The background transmits through the filter 20 so that the image is restructured, and the DC component deteriorates contrast of data dots.

As a result, in order to faithfully reproduce an analog image, the DC component of the image is essential, but the DC component is unnecessary on a digital data page expressed by minute dots. Therefore, only a specific spatial frequency component between the bright spots is extracted by the filter 20, and the other spatial frequency components including the DC component are shielded, so that useless exposure by means of the DC component is prevented and S/N is improved. As a result, only the image edge portion of the signal light is recorded efficiently. Further, since useless exposure is prevented, loss of a dynamic range of the optical recording medium is prevented.

(Diameter and Position of Pinhole)

Figure 10:
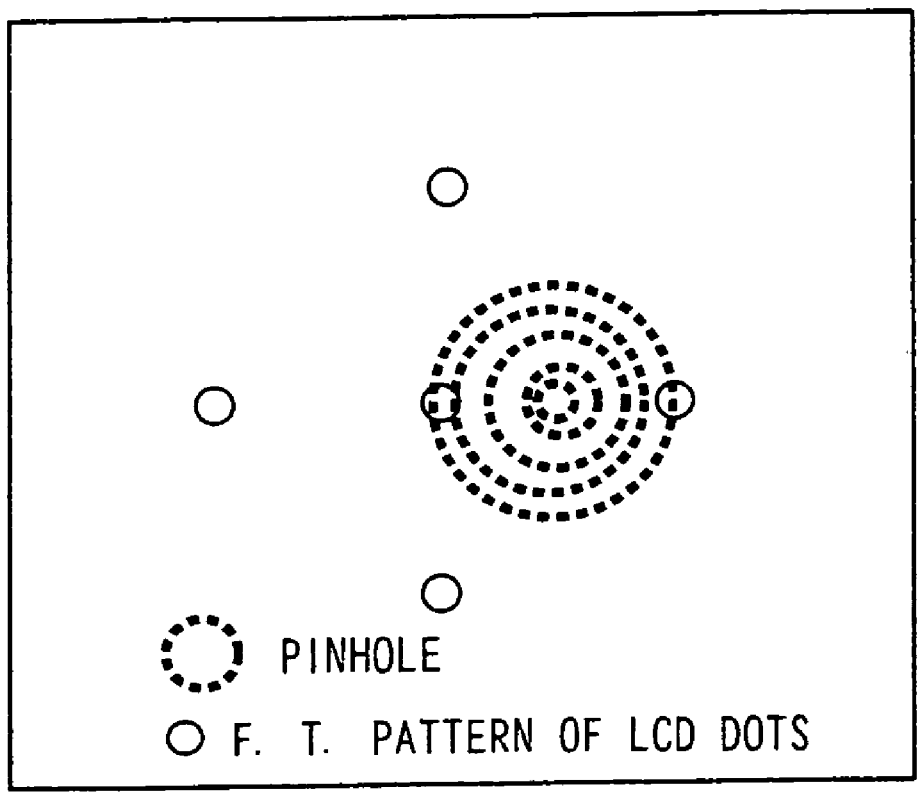
FIG. 10 is a diagram illustrating a size of the pinhole formed on the light blocking body of the filter.

FIG. 10 is a diagram illustrating a size of the pinhole 21 formed on the light blocking body of the filter 20. As shown in FIG. 10, the diameter of the pinhole to be formed so as to be opposed to the position between the 0-th order and the 1-st order on the x axis of the Fourier transformation image is variously changed, and the filtering image is observed. Since the filter 20 is arranged adjacently to the optical recording medium 5, the hologram is recorded in a minute region whose size is approximately the same as an opening sectional area of the pinhole 21. The distance between the bright spots is expressed by $\zeta=f\lambda/d$, and is determined by the focal distance f of the lens, the recording wavelength $\lambda$ and the pixel pitch d of the spatial light modulator. In this example, since experimental conditions are set so that f=300 mm, $\lambda$=532 nm and d=41 µm, the distance $\zeta$ between the bright spots becomes just 4 mm.

As shown by a dotted line in FIG. 10, the diameter of the pinhole 21 is gradually reduced to 4 mm, 3 mm, 2 mm, 1.5 mm, 1 mm and 0.4 mm, and the filtering image is observed. The results are shown in FIGS. 11A to 11F. In this example, the digital image includes minute dot columns which are arranged at 2 pixel pitch, 5 pixel pitch and 10 pixel pitch. The minimum dot of the spatial light modulator corresponds to 1 pixel.

As shown in FIG. 11A, at the pinhole with diameter of 4 mm, the DC component included in the 0-th order light and 1-st order light passes through the filter 20, and S/N of the filtering image is deteriorated. On the contrary, as shown in FIGS. 11B to 11E, at the pinholes with diameters of 1 mm to 3 mm, the DC component included in the 0-th order light and the 1-st order light is shielded by the filter 20, and S/N of the filtering image is improved. On the other hand, as shown in FIG. 11F, when the diameter of the pinhole 21 becomes 0.4 mm ($\zeta/10$) or less, the minimum dot of the spatial light modulator cannot be observed.

According to the above results, it is preferable that a bandwidth r (mm) of the Fourier spectrum, which is necessary for restructuring the digital data expressed by the diameter of the pinhole, namely, the minimum dot of the spatial light modulator without hiatus, is within a range that satisfies the following relationship (1), and more preferable that the range of the bandwidth r satisfies the following relationship (2).

$$0 < r < \zeta (=f\lambda/d) \quad (1)$$

$$\zeta/10 < r < \zeta \quad (2)$$

Figure 12:
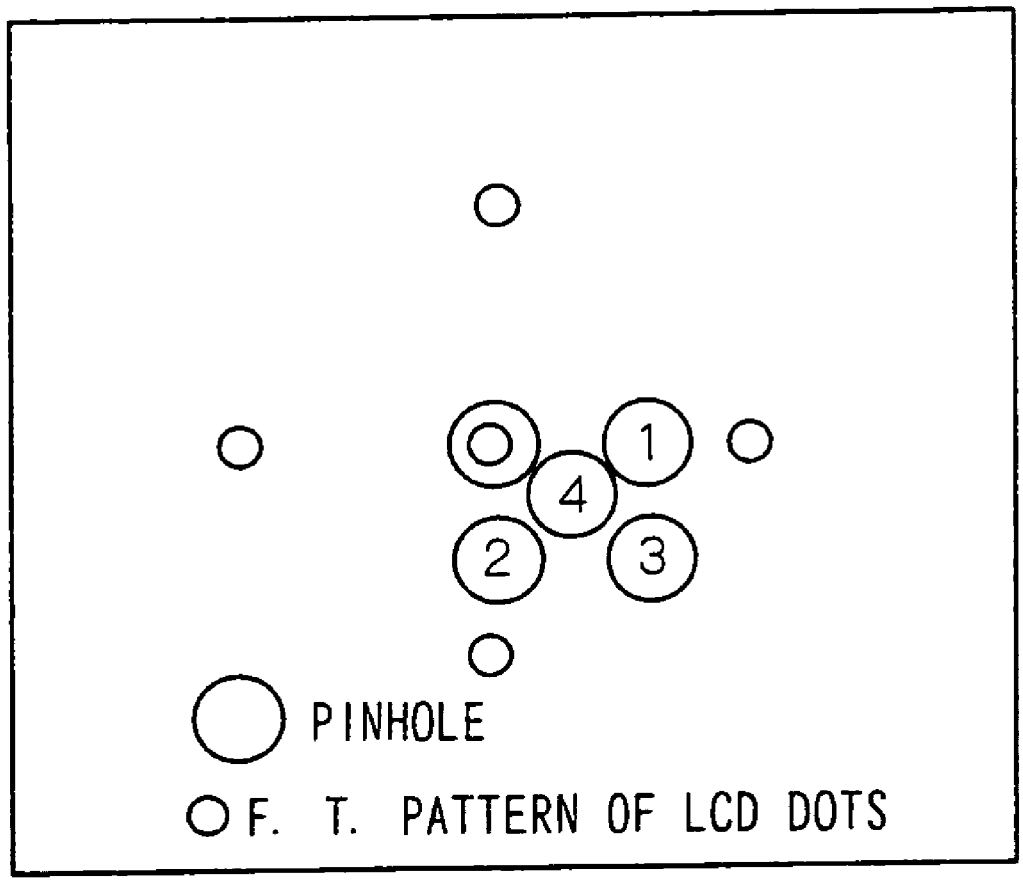
FIG. 12 is a diagram illustrating the position of the pinhole formed on the light blocking body of the filter.

FIG. 12 is a diagram illustrating the position of the pinhole 21 to be formed on the light blocking body of the filter 20. As shown in FIG. 12, the position of the pinhole with diameter of 2 mm is variously changed from the position including the 0-th order (center) of the Fourier transformation image to the positions designated by 1 through 4, and the filtering image is observed. The results are shown in FIGS. 13A to 13E.

As shown in FIGS. 13A to 13E, the minimum dot of the spatial light modulator is observed in all the filtering images regardless of the positions of the pinhole. This means that if the bandwidth r of the Fourier spectrum to be extracted is within the above range, the digital data of one data page can be recorded in one minute region (any one of the regions 1 to 4 in the drawings).

According to the present invention, when a specific Fourier spectrum is extracted and recorded, as shown in FIG. 12 for example, one data page can be recorded in each of the minute regions 1 to 4 within the range of $0<r<\zeta$. That is to say, the recording regions can be miniaturized. In conventional hologram recording, if one data page is recorded in a region of $0<r<2\zeta$, only when the range of $0<r<\zeta$; is divided into four and recording is carried out, the recording density which is 16 times as high as that in the conventional recording can be achieved. It should be noted that only a hologram of one data page is recorded in each divided region, and thus multiplexing is not carried out. When, therefore, the recording regions are miniaturized and additionally the multiplex recording is carried out in each region, the recording density which is higher by at least 1 or more digit than the conventional recording system can be realized. For example, when a random pattern of the reference light is changed and recorded, high-frequency components without correlation can be recorded. That is to say, phase correlating multiplex recording can be carried out.

The above explains the example in which the pinhole is formed so as to be opposed to the position between the 0-th order and the 1-st order on the x axis of the Fourier transformation image. Since the image edge portion is, however, superposed between other adjacent bright spots such as between the 1-st order and the 2-nd order and between the 2-nd order and the 3-rd order at a high frequency, when the pinhole is formed so as to be opposed to positions between another adjacent bright spots, useless exposure by means of a DC component is prevented and S/N is improved. As a result, only the image edge portion of the signal light is recorded efficiently.

(Hologram Reproducing Apparatus)

Figure 14:
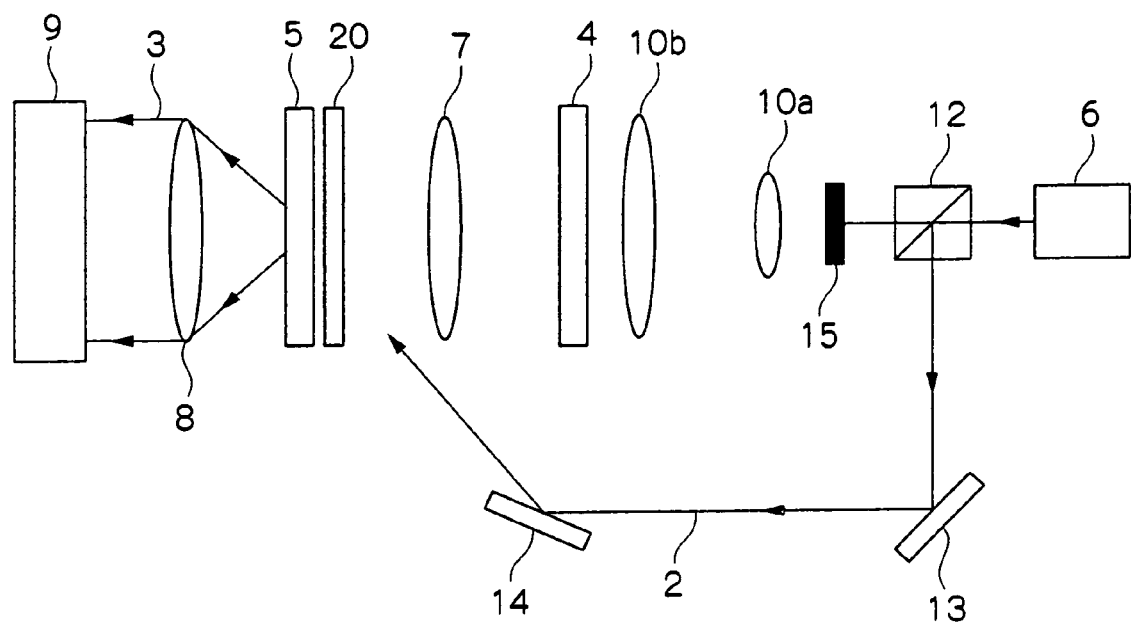
FIG. 14 is a diagram illustrating one example of a constitution of a hologram reproducing apparatus.

FIG. 14 is a diagram illustrating one example of a constitution of the hologram reproducing apparatus. The hologram reproducing apparatus is constituted so that a Fourier transforming lens 8 and a two-dimensional photodetector 9 such as a photodetector array of CCD, CMOS array and the like are added to the hologram recording apparatus shown in FIG. 7. Digital data are recorded in the optical recording medium 5 according to the above-mentioned method.

At the time of reproducing the hologram, the shutter 15 is inserted into the optical path by the driving device, not shown, so that light for signal light is shielded. As a result, only the reference light 2 passes through the pinhole 21 of the filter 20, so as to be irradiated to a region of the optical recording medium 5 where the hologram is recorded. The irradiated reference light 2 is diffracted by the hologram.

Since a Fourier transformation image is recorded onto the optical recording medium 5, diffraction light 3 is inversely Fourier-transformed by the Fourier transforming lens 8, so that a reproduced image where the image edge portion of the signal light is enhanced can be observed on a focal plane of the Fourier transforming lens 8. The reproduced image is detected by the photodetector 9, so that the digital data owned by the image edge portion of the signal light can be read.

(Modified Example of the Filter)

Figure 17:
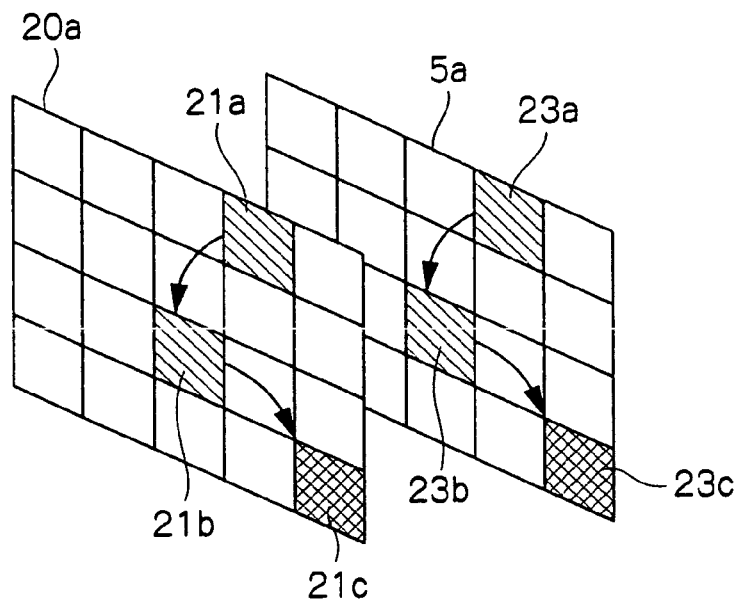
FIG. 17 is a diagram illustrating an example using the spatial light modulator as a programmable filter.

The above embodiment explains the example in which the light blocking body which has the pinhole is used as the filter, but the spatial light modulator can be used instead of such a light blocking body. When the spatial light modulator is used as the filter, the position of the pinhole can be changed programmably. For example as shown in FIG. 17, in the case where the spatial light modulator is used as the programmable filter 20a, the position of the light transmission section (pinhole) can be sequentially shifted to 21a, 21b and 21c. As a result, a data page can be recorded sequentially in different regions 23a, 23b and 23c of the optical recording medium 5a without moving the optical recording medium 5a.

Figure 18:
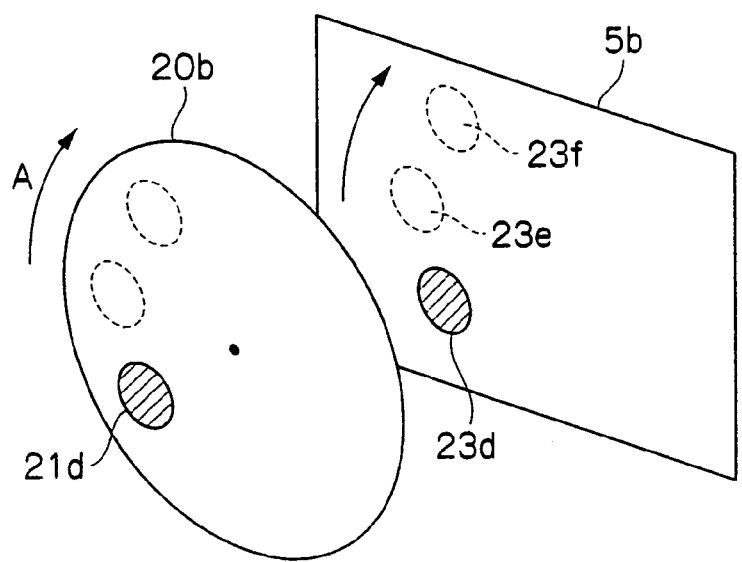
FIG. 18 is a diagram illustrating an example using a turret which has a pinhole as a filter.

Further, a rotor plate such as a turret can be used instead of the fixed type light blocking body. When the rotation type filter is used, a data page can be recorded sequentially in different regions of the optical recording medium 5a. For example as shown in FIG. 18, in the case where the turret which has the pinhole 21d is used as the filter 20b, the turret can be rotated to a predetermined direction (direction of arrow A in the drawing), so that a data page can be recorded sequentially in different regions 23d, 23e and 23f of the optical recording medium 5b without moving the optical recording medium 5b.

(Coaxial Recording)

Figure 15:
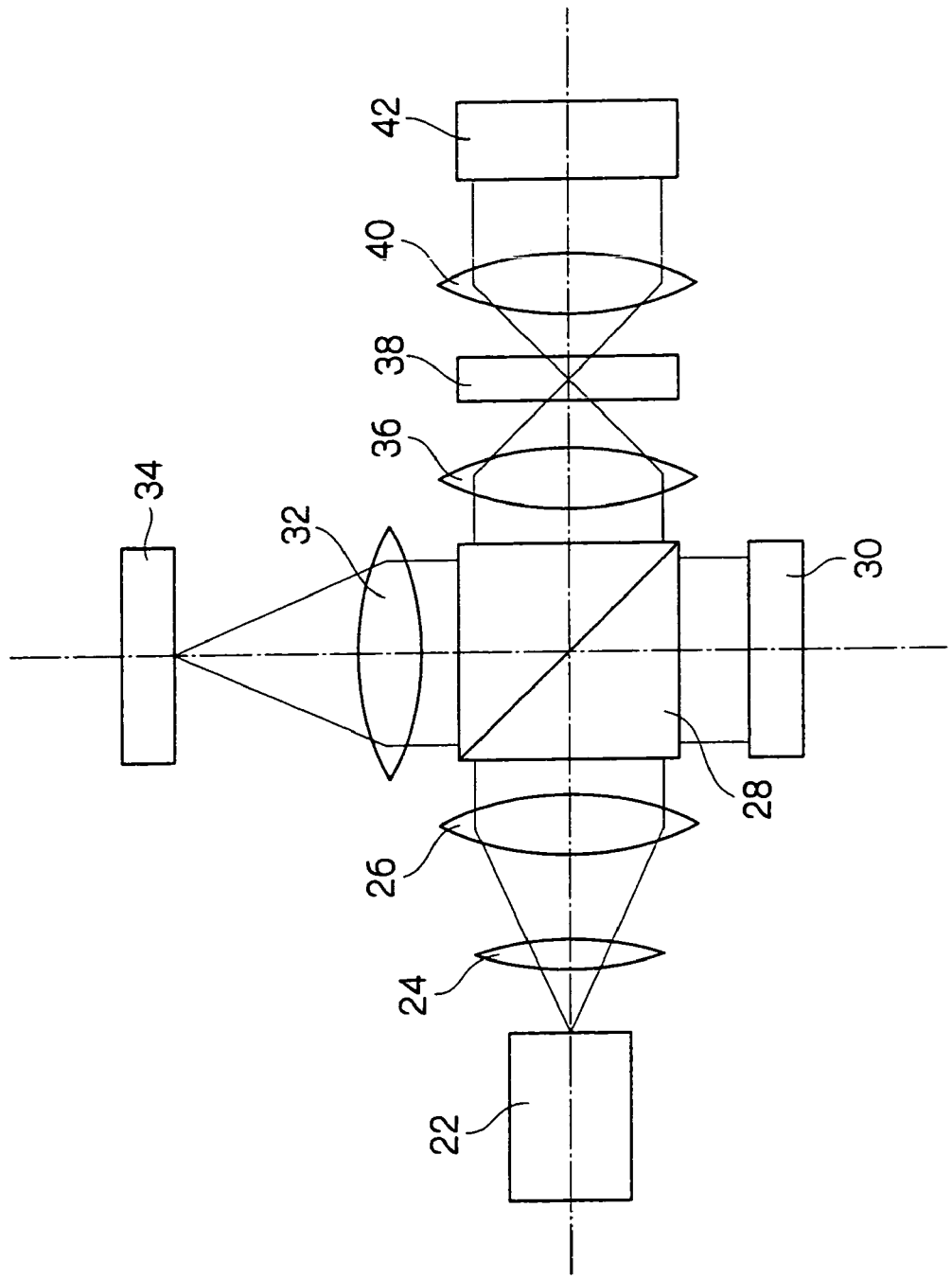
FIG. 15 is a diagram illustrating one example of a hologram recording/reproducing apparatus having a coaxial constitution.

The above embodiment explains the example in which the signal light and the reference light are irradiated from different directions, but the signal light and the reference light can be irradiated coaxially. FIG. 15 illustrates one example of a hologram recording/reproducing apparatus having a coaxial constitution.

The hologram recording/reproducing apparatus is provided with the light source 22 which emits a laser beam as coherent light. The collimating lenses 24 and 26 are arranged on a laser beam emission side of the light source 22. A polarization beam splitter 28, which allows only polarization light in a predetermined direction to transmit, is arranged on a light transmission side of the collimating lenses 24 and 26. The reflection type spatial light modulator 30, which modulates the laser beam according to digital data supplied from the computer, not shown, and generates the digital image (signal light) for each page and the reference light, is arranged on a light reflection side of the polarization beam splitter 28.

The laser beam emitted from the light source 22 is collimated into a beam with large diameter by the collimating lenses 24 and 26 so as to enter the polarization beam splitter 28 and be reflected to the direction of the spatial light modulator 30. Digital data are input from the computer, not shown, into the spatial light modulator 30, and the intensity of the laser beam is modulated according to the supplied digital data so that the signal light and the reference light are generated.

Figure 16:
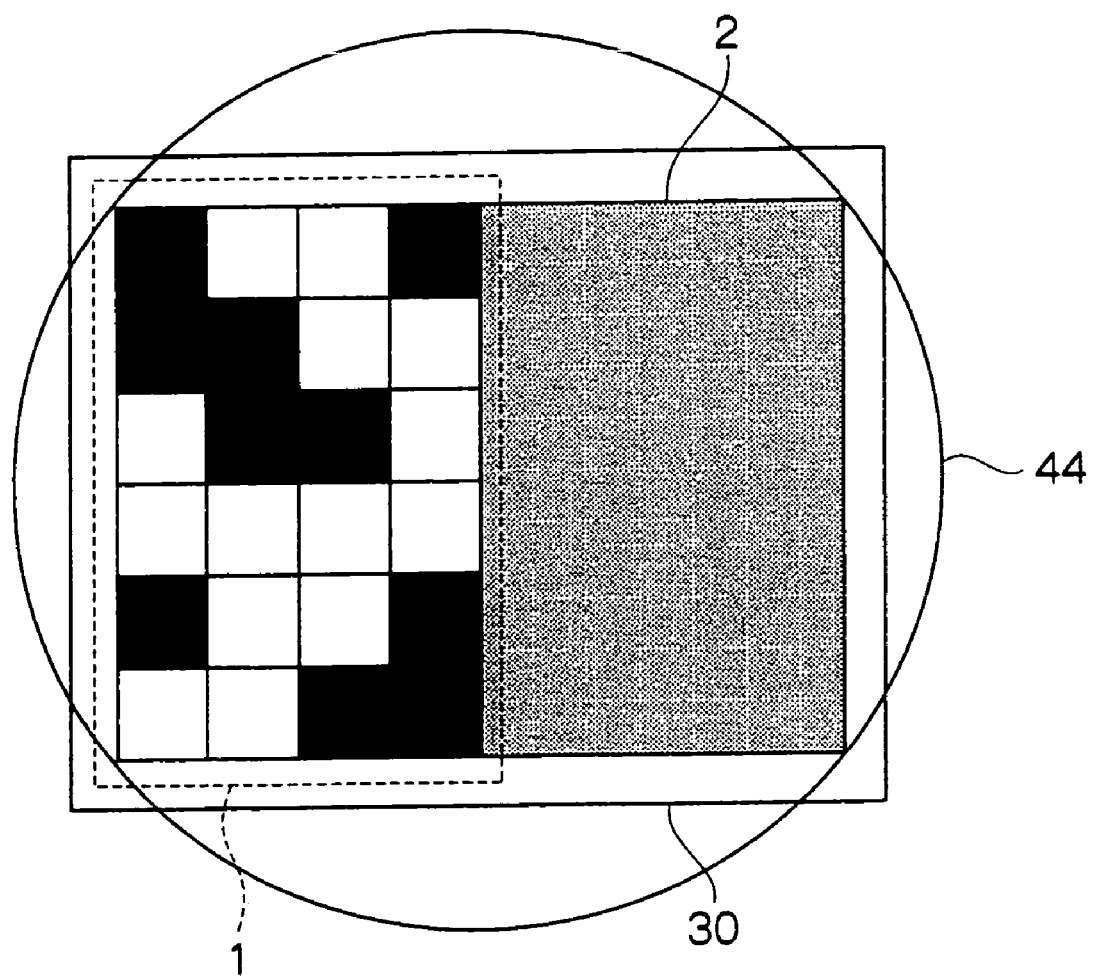
FIG. 16 is a diagram illustrating a constitution of a spatial light modulator that generates signal light and reference light simultaneously.

At this time, as shown in FIG. 16, a left half of the spatial light modulator 30 is used for displaying the data, and the intensity of incident light 44 which enters the left half of the spatial light modulator 30 is modulated so that the light reflected from the left half is the signal light 1. Meanwhile, the intensity or the phase of the incident light 44 at the right half of the spatial light modulator 30 is modulated by the data for reference light (random pattern or the like), so that light reflected from the right half is the reference light 2. The signal light and the reference light reflected from the spatial light modulator 30 enter the polarization beam splitter 28, so as to transmit through the polarization beam splitter 28.

The Fourier transforming lens 32 is arranged on a light transmission side of the polarization beam splitter 28. Further, a reflection type spatial light modulator 34 is arranged as a programmable filter on a light transmission side of the Fourier transforming lens 32.

The signal light and the reference light transmitted through the polarization beam splitter 28 are Fourier-transformed by the Fourier transforming lens 32. The Fourier-transformed signal light and reference light are irradiated to the spatial light modulator 34. The spatial light modulator 34, which is arranged as the programmable filter, filtrates (extracts) only a specific Fourier spectrum, and polarizes and modulates it so as to reflect it to the direction of the Fourier transforming lens 32. The filtrated signal light and reference light are inversely Fourier-transformed by the lens 32 so as to again enter the polarization beam splitter 28, and is reflected by the polarization beam splitter 28.

An objective lens 36 with high NA is arranged on a light reflection side of the polarization beam splitter 28. The signal light and the reference light reflected by the polarization beam splitter 28 are Fourier-transformed by the objective lens 36, so as to be irradiated to the optical recording medium 38 simultaneously and coaxially. The reference light is irradiated to a region to which the Fourier-transformed signal light is irradiated. As a result, the Fourier-transformed signal light and reference light interfere with each other in the optical recording medium 38, so that an image edge portion of the signal light is recorded as a hologram on the optical recording medium 38.

It should be noted that when the reference light is coaxial with the signal light, also the 0-th order component (DC component) of the reference light can be simultaneously cut (band-pass filtered) by the spatial light modulator 34 arranged as the programmable filter. In this case, the random pattern of the reference light is suitably selected, so that the pattern of the band-pass filtered Fourier spectrum can be changed greatly. This is because a DC component (0-th order component) of the reference light which is always common is not included. For this reason, when a pseudo-random pattern is selected as the reference light, a plurality of reference light beams without correlation can be obtained on a recording surface, so that multiplex recording can be performed in one region by using these reference light beams.

Further, an objective lens 40 with high NA and a two-dimensional photodetector 42 such as CMOS array are arranged on a reproduced light irradiation side of the optical recording medium 38, and when the hologram is reproduced, only the reference light is irradiated to a region of the optical recording medium 38 in which the hologram is recorded. The irradiated reference light is diffracted by the hologram. When the diffraction light is inversely Fourier-transformed by the objective lens 40, a reproduced image in which the image edge portion of the signal light is enhanced can be observed on a focal plane of the objective lens 40. The reproduced image is detected by the photodetector 42 so that the digital data owned by the image edge portion of the signal light can be read.

As explained above, in the case of the coaxial recording, the reference light and the signal light pass through the common optical system and are Fourier-transformed simultaneously by the lens, the Fourier spectrum minimally necessary for recording data is extracted by the band-pass filter, and this is emitted to the medium so that the hologram is recorded. Since the reference light is also band-pass filtered light, the Fourier spectrum is changed according to a change in the reference light pattern, and multiplex recording can be carried out in one region without moving the optical recording medium.

Further, since unnecessary components such as DC component and high-order component of the reference light and the signal light are not used for exposure, S/N is improved and the loss of the dynamic range does not occur, so that a recording capacity of about $V/\lambda^3$ bit which is close to a limit of volume recording can be realized.

(Shape of the Pinhole)

Further, the above embodiment explains the example in which the pinhole having a circular shape is formed. However, the opening shape of the pinhole is not limited to the circular shape. For example, a pinhole which has a polygonal shape or a rectangular shape may be formed.

(Constitution of Data Page)

When the DC components are eliminated from a binary digital image (signal light) in which ratios of black and white are the same, it is observed that S/N is deteriorated at the time of reproduction. When various constitutions of a data page are examined based on the observation, it is found that S/N is improved by the following two methods.

(1) Signal light components of a digital image are isolated.

(2) A ratio of the signal light components to pixels or pixel blocks of the digital image is increased.

Figure 19:
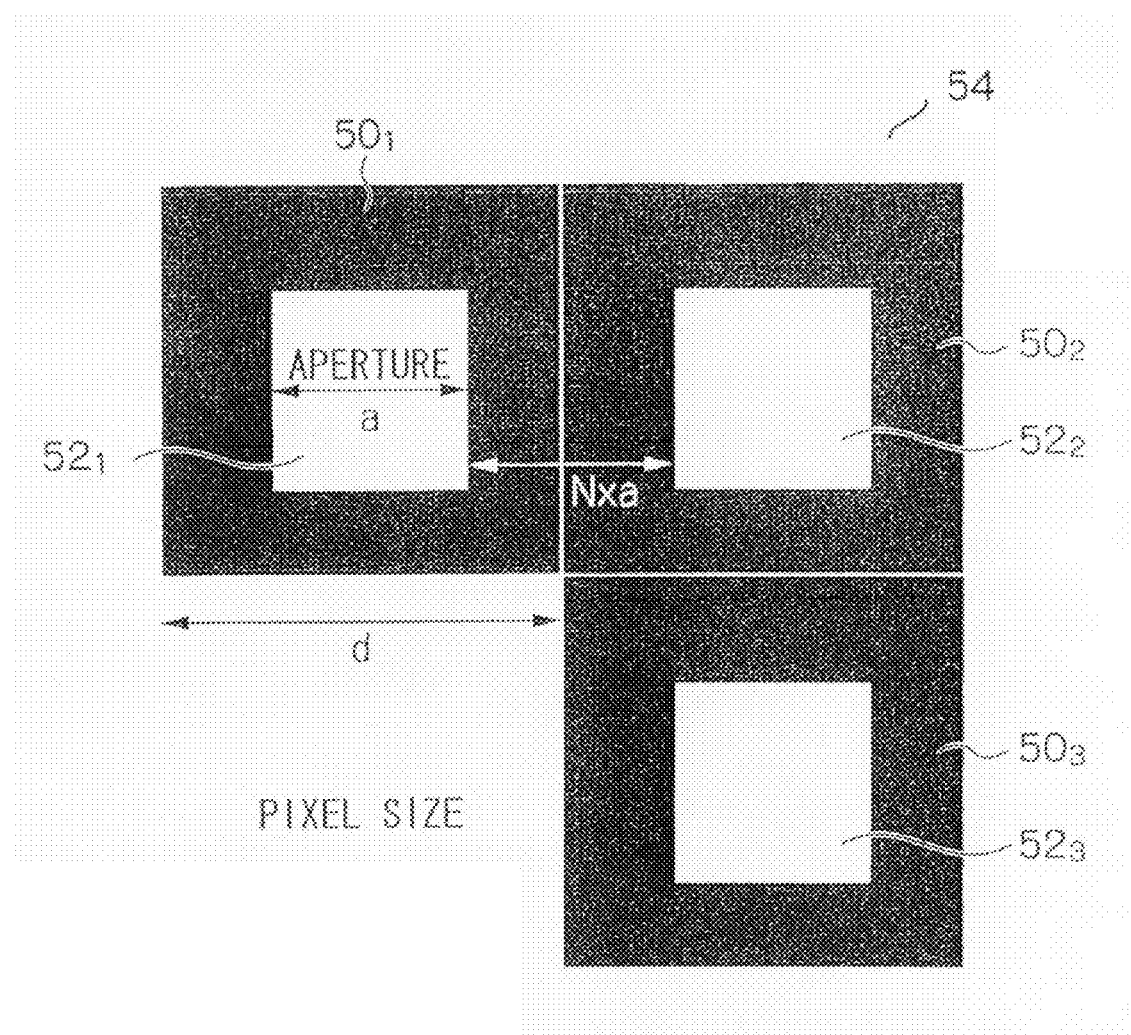
FIG. 19 is a diagram illustrating that the signal light components are arranged to be separated from one another.

In FIG. 1, the example where the respective signal light components are arranged without a gap is explained. However, in order to improve the resolution of the signal light components, as shown in FIG. 19, it is preferable that black matrices 54 are provided around the signal light components and the like, and the signal light components $52_1$ to $52_3$ of the pixels $50_1$ to $50_3$ are arranged so as to be separated from one another. Hereinafter, when it is not necessary to distinguish the pixels $50_1$ to $50_3$, they are referred to as "pixels 50", and when it is not necessary to distinguish the signal light components $52_1$ to $52_3$, they are referred to as "signal light components 52".

The pixels 50 and the signal light components 52 have a concentric square shape. When a length of one side of the pixels 50 (pixel size) is designated by d, a length of one side of the signal light components (openings) 52 is designated by a, and an arrangement interval of the signal light components 52 is N×a, the aperture ratio expressed by a/d becomes 1/(N+1). For example, when the signal light components are arranged in the pixel blocks composed of plural pixels such as 3×3 pixels, respectively, a length of one side of the pixel blocks is designated by d.

As a result of various experiments, in the case where the arrangement interval of the signal light components is made to be equal to the length "a" of one side of the signal light components (N=1, a/d=0.5), it is found that when the DC components is eliminated, the signal light is not reproduced. When the arrangement interval of the signal light components 52 is set to be larger than a (N>1) so that the light signal components are isolated, it is found that this problem can be avoided. When N>1, the aperture ratio expressed by a/d becomes smaller than 0.5. When N becomes larger, S/N of the signal light (positive image) is further improved.

Further, the aperture ratio expressed by a/d is set to be larger than 0.5. Hereby, it is found that even if the DC component is eliminated, an inverted image (negative image) of the signal light is recorded and reproduced, and S/N of the negative image is further improved as the aperture ratio gets closer to 1. This can also avoid the above problem. A mechanism in which the negative image of the signal light is generated can be estimated as follows.

That is, removal of the DC component is equal to interference, with the signal light, of a plane wave which has uniform signal light and entire intensity and a phase difference π. For example, in the case of the plane wave where the entire signal light is composed of the DC components, when the plane wave with phase difference π is interfered at the same intensity, the signal light becomes 0. In the case where, therefore, the DC components of the signal light modulated with digital data are eliminated, this case is equal to a result of interfering the plane wave, having the same total intensity and the phase difference π, with original signal light. In this case, a bright portion becomes dark due to negative interference, and a dark portion becomes bright because only a light wave is applied to this portion.

Figure 20:
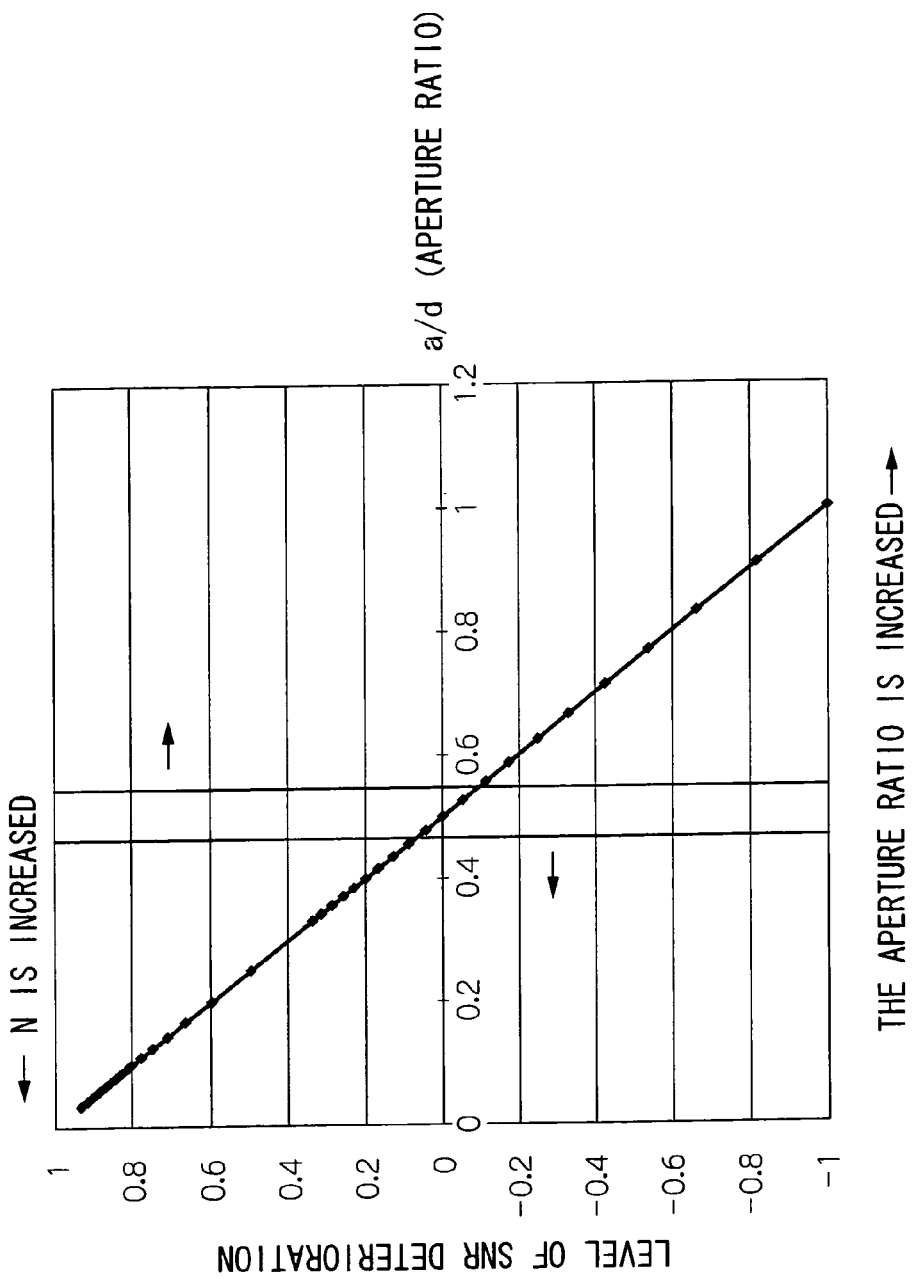
FIG. 20 is a graph of S/N deterioration levels plotted with respect to the aperture ratio.

Further, according to the experimental results, empirically, it is found that a ratio of S/N after the DC component is eliminated to S/N before the DC component is eliminated (degree of S/N deterioration) is defined by the following formula. FIG. 20 is a graph where the degree of S/N deterioration is plotted against the aperture ratio. When an absolute value of the degree of S/N deterioration is smaller, S/N is deteriorated more remarkably.

$$\text{degree of } SNR \text{ deterioration} = \left\{ \left(\frac{N}{N+1}\right)^2 - \left(\frac{1}{N+1}\right)^2 \right\} = \frac{N-1}{N+1}$$

When the absolute value of the degree of S/N deterioration is not larger than 0.1, an original digital image (or its inverted image) cannot be visually perceived. According to the result of FIG. 20, therefore, when the signal light (positive image) is recorded and reproduced, the aperture ratio expressed by a/d is preferably within the following range:

$$0 < a/d < 0.45.$$

On the other hand, when the inverted image (negative image) of the signal light is recorded and reproduced, the aperture ratio expressed by a/d is preferably within the following range:

$$0.55 < a/d < 1.$$

Figure 21:
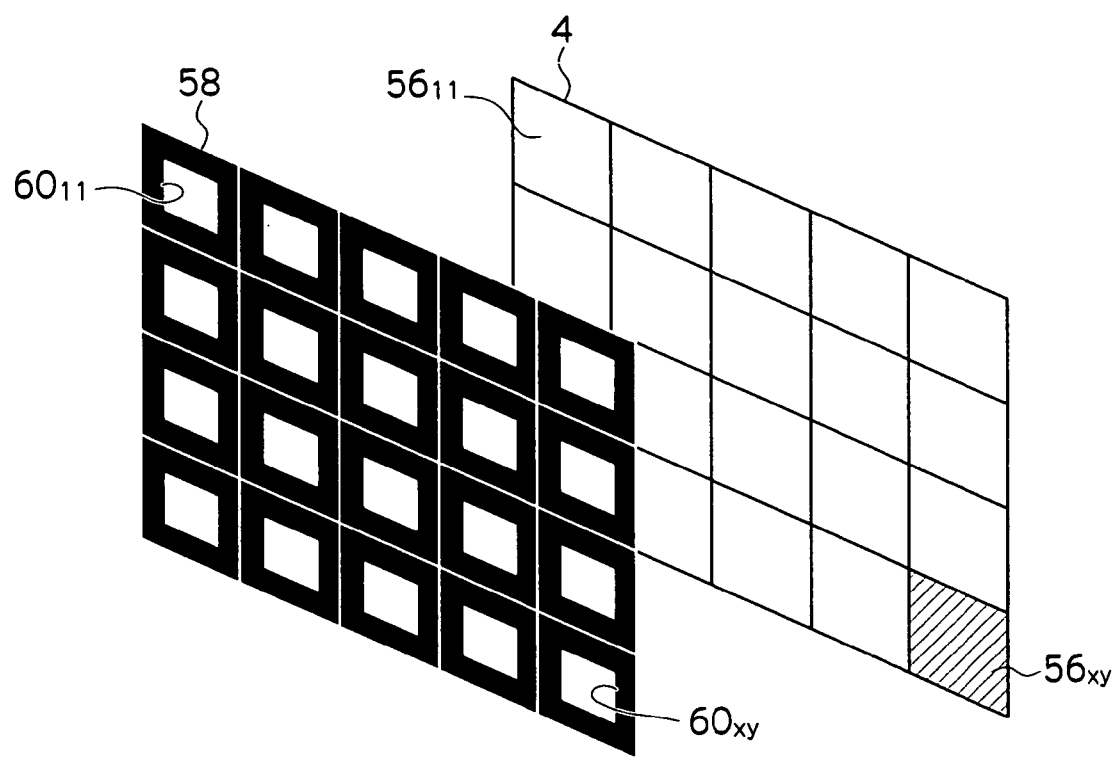
FIG. 21 is a diagram illustrating an example of a black matrix mask.

The above-mentioned data page can be created in the hologram recording apparatus shown in FIG. 7 by arranging a mask 58 so that it is close to a light emission side of a spatial light modulator 4. As shown in FIG. 21, the mask 58 is a black matrix mask of the spatial light modulator 4 where openings $60_{11}$ to $60_{xy}$ are provided corresponding to pixels $56_{11}$ to $56_{xy}$, which are arranged in a matrix pattern of x rows and y columns. Hereinafter, when it is not necessary to distinguish the pixels $56_{11}$ to $56_{xy}$, they are referred to as "pixels 56", and when it is not necessary to distinguish the openings $60_{11}$ to $60_{xy}$, they are referred to as "openings 60". Further, also when the pixels 56 of the spatial light modulator 4 are arranged via the black matrix, the above-mentioned data page can be created similarly.

In the present invention, the Fourier transformation image of a digital image is a regular diffraction grating, and its Fourier transformation spectrum has a peak according to DC component of each order at each bright spots. As a result of the keen examination, according to the knowledge obtained by the inventors and the others, information which is necessary for recording and reproducing the edge portion of the digital image (referred to as "image edge component") is superposed between the bright spots at high frequency. That is to say, "image edge component" is all the spectrums other than the DC component of the Fourier spectrum of the digital image.

Further, according to the present invention, when a specific spatial frequency component between the bright posts is extracted from the Fourier transformation image so as to be recorded, the digital image can be recorded and reproduced, and useless exposure due to the DC component is prevented so that S/N can be improved. Further, since a part of the Fourier transformation image is extracted and recorded, the recording region is miniaturized so that high-density recording can be realized.

As described above, according to the hologram recording method and apparatus of the present invention, the effect is achieved that digital data can be recorded as a hologram at high S/N and in high density.

What is claimed is:

1. A hologram recording method, comprising:
   eliminating all DC components of the 0-th order to the n-th order of a Fourier transformation image from the Fourier transformation image of a signal light for expressing binary digital data as a brightness image, where n is an integer of 1 or more; and
   irradiating an optical recording medium simultaneously with the signal light from which all the DC components have been eliminated and a reference light to record an image edge portion of the signal light onto the optical recording medium as a hologram.

2. The hologram recording method according to claim 1, wherein all the DC components of the 0-th order to the n-th order of the Fourier transformation image are eliminated from the Fourier transformation image by blocking the DC component using a filter disposed at a signal light irradiation-side of the optical recording medium.

3. The hologram recording method according to claim 2, wherein the reference light is irradiated via the filter onto a region of the optical recording medium which is to be irradiated with the signal light.

4. The hologram recording method according to claim 1, wherein the signal light and the reference light are irradiated coaxially.

5. The hologram recording method according to claim 1, wherein a plurality of holograms are multiplexed on the same region.

6. The hologram recording method according to claim 5, wherein a random pattern of the reference light is altered so that the plurality of holograms are phase-correlated multiplexed.

7. The hologram recording method according to claim 1, wherein the signal light is disposed such that signal light components of pixels or pixel blocks of the brightness image are separated from one another.

8. The hologram recording method according to claim 7, wherein a shape of the pixels or the pixel blocks and a shape of the signal light components are concentric square shapes.

9. The hologram recording method according to claim 8, wherein an arrangement spacing of the signal light components is larger than the length of one side of the signal light components, and a positive image of the brightness image is recorded as a hologram.

10. The hologram recording method according to claim 9, wherein when the length of one side of the pixels or the pixel blocks is designated by d and the length of one side of the signal light components is designated by a, an aperture ratio expressed by a/d is less than 0.5.

11. The hologram recording method according to claim 10, wherein the aperture ratio is within the following range:

$$0 < a/d < 0.45.$$

12. The hologram recording method according to claim 8, wherein when the length of one side of the pixels or the pixel blocks is designated by d and the length of one side of the signal light components is designated by a, an aperture ratio expressed by a/d is larger than 0.5, and a negative image of the brightness image is recorded as a hologram.

13. The hologram recording method according to claim 12, wherein the aperture ratio is within the following range:

$$0.55 < a/d < 1.$$

* * * * *